(12) United States Patent
Endo et al.

(10) Patent No.: US 6,513,547 B2
(45) Date of Patent: Feb. 4, 2003

(54) SOLENOID-OPERATED VALVE MANIFOLD

(75) Inventors: Katsuhisa Endo, Tsukuba (JP); Koichiro Gemma, Ibaraki-ken (JP)

(73) Assignee: SMC Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/820,642

(22) Filed: Mar. 30, 2001

(65) Prior Publication Data

US 2001/0027813 A1 Oct. 11, 2001

(30) Foreign Application Priority Data

Apr. 7, 2000 (JP) ........................................ 2000-106758

(51) Int. Cl.[7] .......................... F16K 31/06; F16K 11/10
(52) U.S. Cl. ........................................ 137/560; 137/884
(58) Field of Search ........................ 137/269, 270, 137/271, 560, 884

(56) References Cited

U.S. PATENT DOCUMENTS

| | | | | |
|---|---|---|---|---|
| 5,495,871 A | * | 3/1996 | Meloche et al. .............. 137/884 |
| 5,558,126 A | * | 9/1996 | Hayashi et al. .......... 137/269 X |
| 5,566,718 A | * | 10/1996 | Nagai et al. ................. 137/884 |
| 5,597,015 A | * | 1/1997 | Asou et al. .............. 137/884 X |
| 5,699,830 A | * | 12/1997 | Hayashi et al. .......... 137/560 X |
| 5,749,395 A | * | 5/1998 | Hayashi et al. .......... 137/884 X |
| 5,884,664 A | * | 3/1999 | Nagai et al. ................. 137/884 |
| 5,887,623 A | * | 3/1999 | Nagai et al. ................. 137/884 |
| 5,915,666 A | * | 6/1999 | Hayashi et al. .......... 137/884 X |
| 6,109,298 A | * | 8/2000 | Kaneko et al. .......... 137/560 X |
| 6,142,182 A | * | 11/2000 | Akimoto .................. 137/884 X |

FOREIGN PATENT DOCUMENTS

EP 0 810 397 12/1997

* cited by examiner

Primary Examiner—John Rivell
(74) Attorney, Agent, or Firm—Paul A. Guss

(57) ABSTRACT

Substrates, in each of which all or parts of electronic parts including IC for communication are carried in a form of bare chip, are mounted on solenoid-operated valves attached onto manifold blocks for constructing a solenoid-operated valve manifold. Accordingly, it is possible to miniaturize the solenoid-operated valve manifold.

18 Claims, 9 Drawing Sheets

SOLENOID-OPERATED VALVE MANIFOLD

BACKGROUND OF THE INVENTION

1. Field of the Invention

The present invention relates to a solenoid-operated valve manifold. In particular, the present invention relates to a solenoid-operated valve manifold in which a substrate, on which electronic parts including an integrated circuit for communication (IC for communication) are carried in a state of bare chip, is mounted on a solenoid-operated valve or a manifold so that a small size is successfully realized.

2. Description of the Related Art

Conventionally, when the serial transmission is performed, a solenoid-operated valve manifold includes a plurality of solenoid-operated valves attached on a manifold, in which driver circuits having photocouplers are carried on the plurality of solenoid-operated valves respectively. Further, the manifold contains a serial/parallel converter for converting the serial signal into the parallel signal, and it is provided with electric connectors and other components for signal lines and power source lines.

However, in the case of such a solenoid-operated valve manifold, substrates for the driver circuits for driving the solenoid-operated valves are arranged for the plurality of solenoid-operated valves respectively. Further, the substrate for the serial/parallel converter, which is mounted with the electronic parts including the integrated circuit for communication, is arranged on the manifold.

Therefore, in order to further miniaturize the solenoid-operated valve manifold, it is necessary to decrease the sizes of the substrates.

SUMMARY OF THE INVENTION

A general object of the present invention is to provide a solenoid-operated valve manifold in which all or parts of electronic parts including integrated circuits for communication are carried on substrates in a state of bare chips, and the substrates are mounted on solenoid-operated valves or a manifold to reduce the volume of the solenoid-operated valve manifold so that the size is successfully miniaturized.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
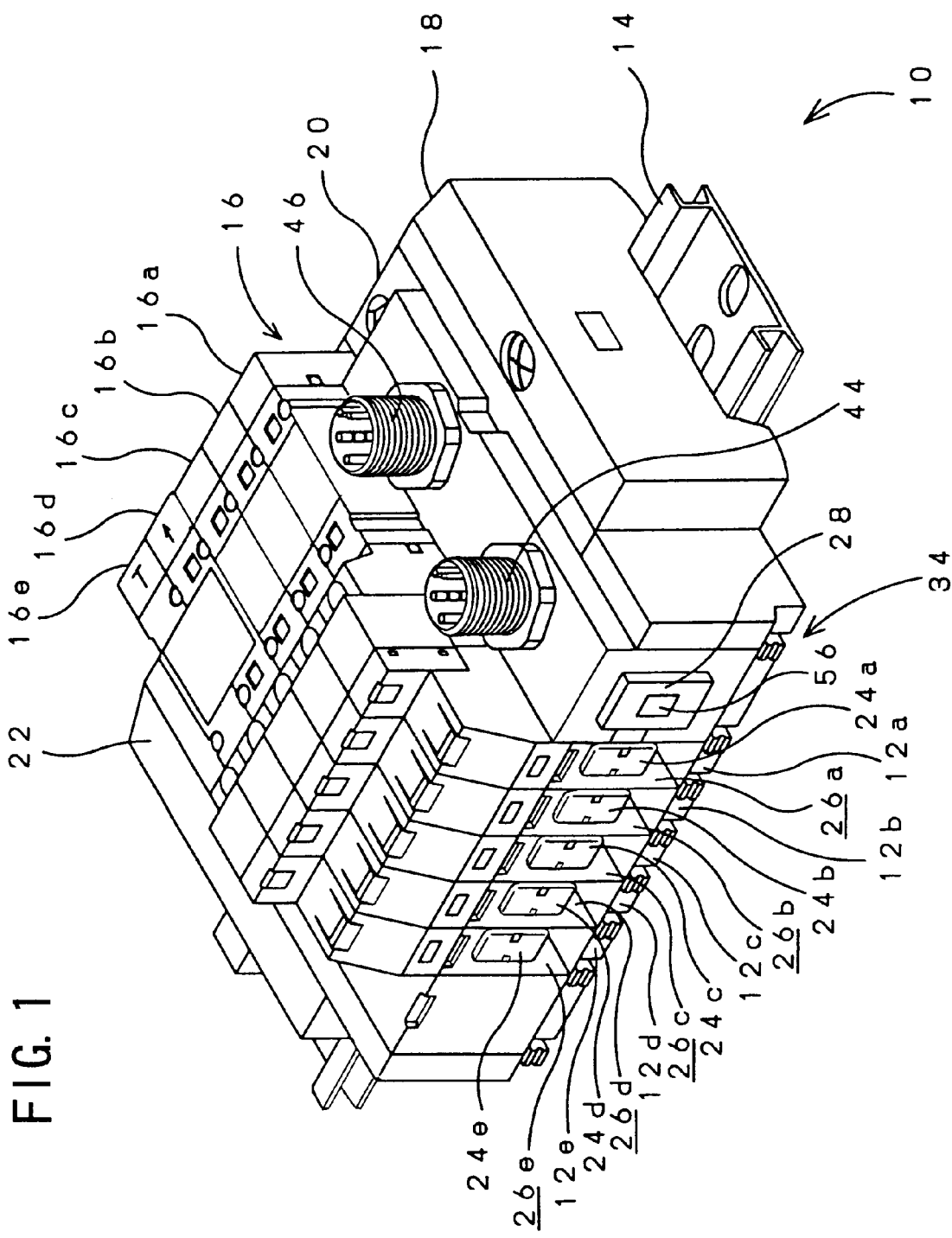
FIG. 1 shows a perspective view illustrating a solenoid-operated valve manifold according to a first embodiment of the present invention.

FIG. 1 shows a solenoid-operated valve manifold 10 according to an embodiment of the present invention. As shown in FIG. 1, the solenoid-operated valve manifold 10 comprises a plurality of manifold blocks 12a to 12e which are arranged adjacently side by side in parallel to construct a manifold 34 which is carried on a rail 14. Solenoid-operated valves 16a to 16e are attached to the manifold blocks 12a to 12e respectively. A mediating unit 20, which is integrated by an end plate 18 carried on the rail 14, is attached to one side surface of the manifold block 12a. An end plate 22, which is carried on the rail 14, is attached to one side surface of the manifold block 12e.

Figure 2:
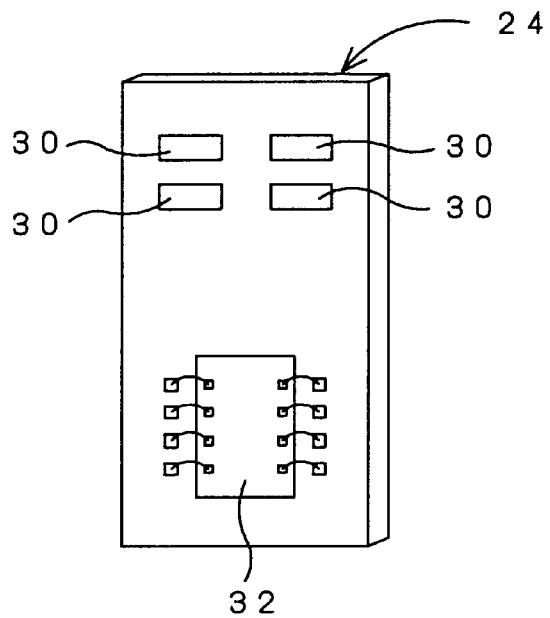
FIG. 2 shows a magnified perspective view illustrating a substrate provided for the solenoid-operated valve manifold shown in FIG. 1.
Figure 7:
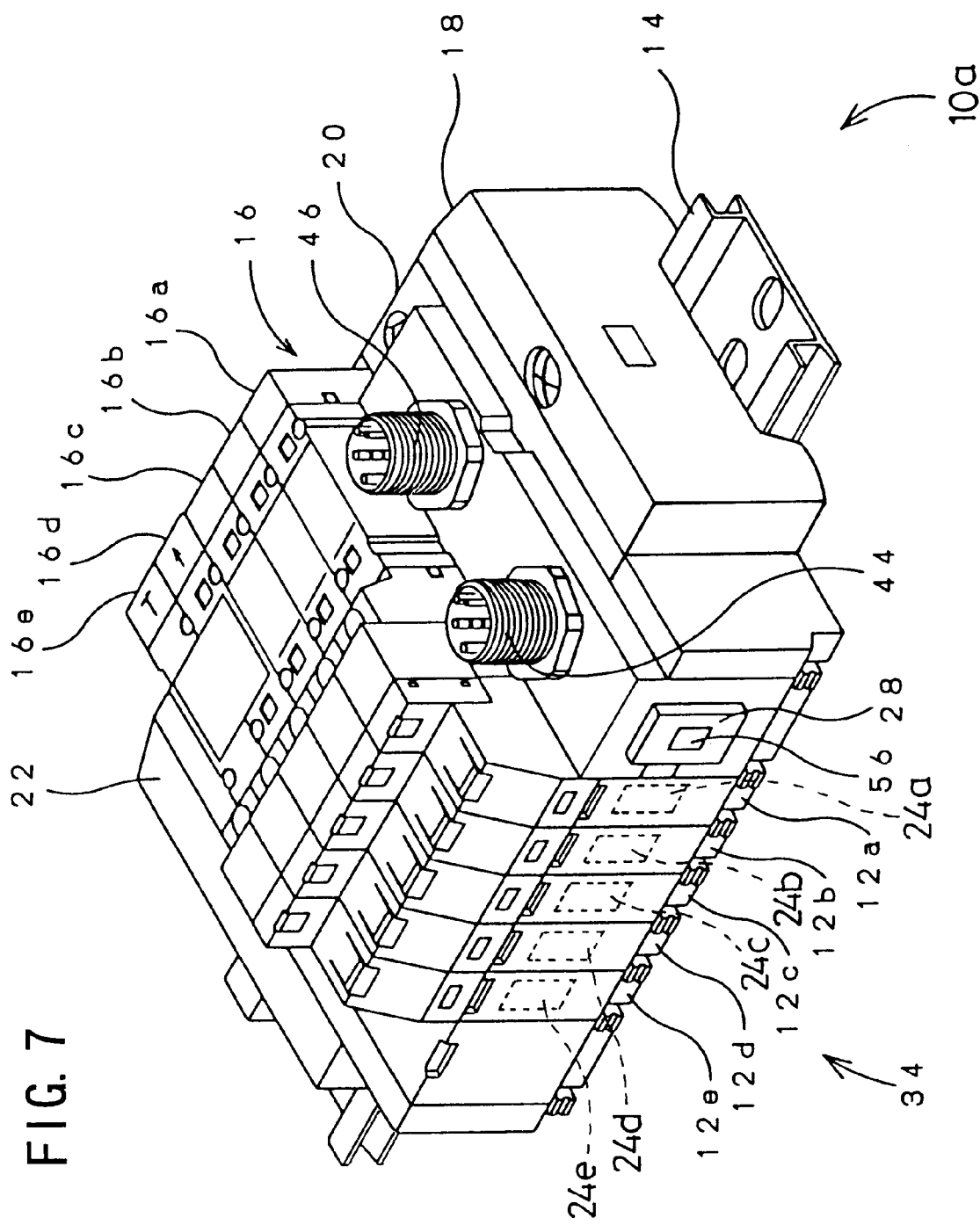
FIG. 7 shows a perspective view illustrating a modified embodiment of the solenoid-operated valve manifold shown in FIG. 1, depicting a state in which a substrate is mounted at the inside of each of manifold blocks.

As shown in FIG. 2, a substrate 24 carries a plurality of electronic parts 30 and an integrated circuit 32 for communication (hereinafter referred to as "IC for communication 32") in a state of bare chip. The substrate 24 is attached by the aid of pins (not shown) provided for each of recesses 26a to 26e which are defined on the respective side surfaces of the manifold blocks 12a to 12e. As shown in FIG. 7, the substrates 24a to 24e may be attached by the aid of unillustrated pins at the inside of the manifold blocks 12a to 12e.

Figure 6:
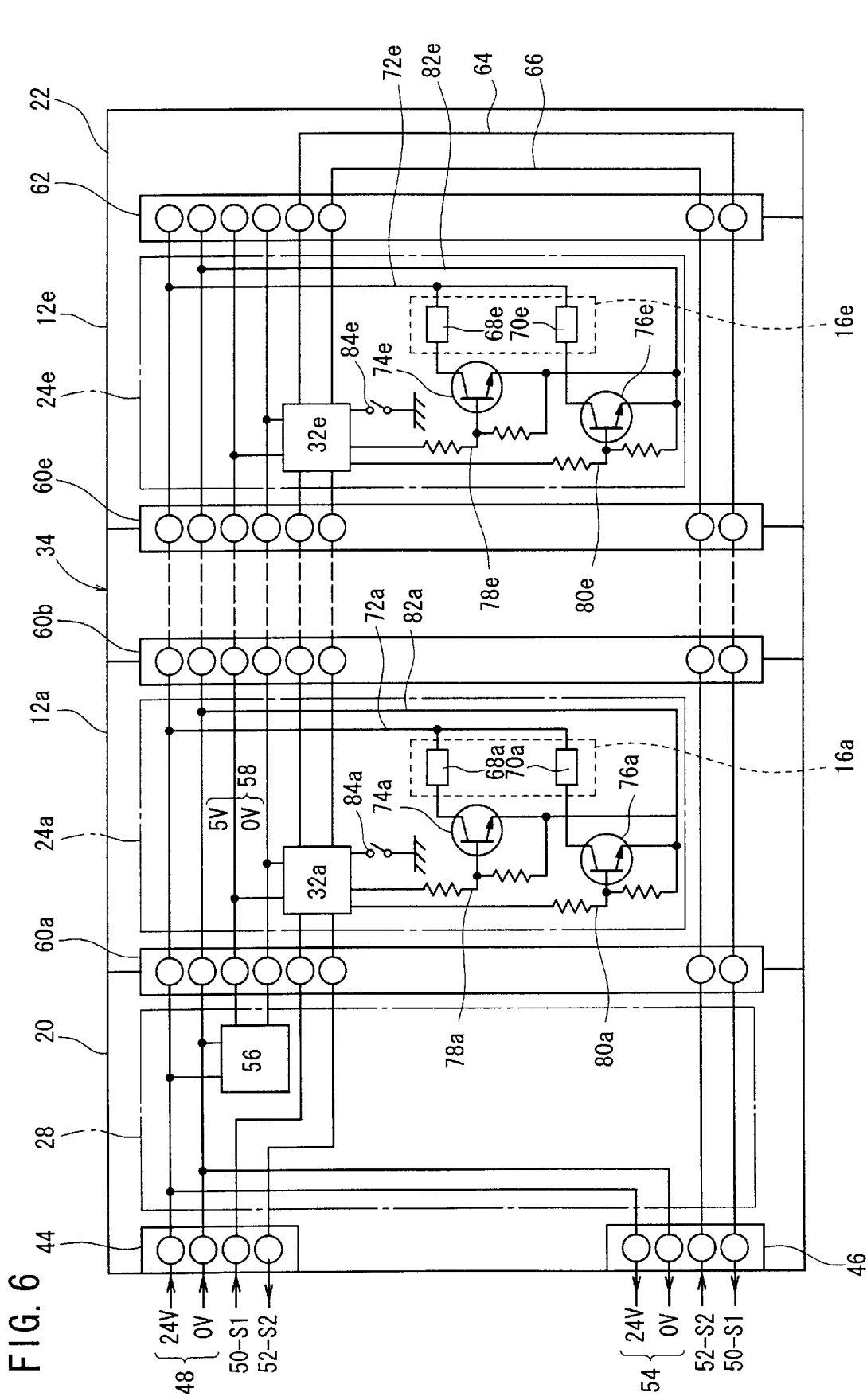
FIG. 6 shows an electric wiring diagram of the solenoid-operated valve manifold shown in FIG. 1.
Figure 11:
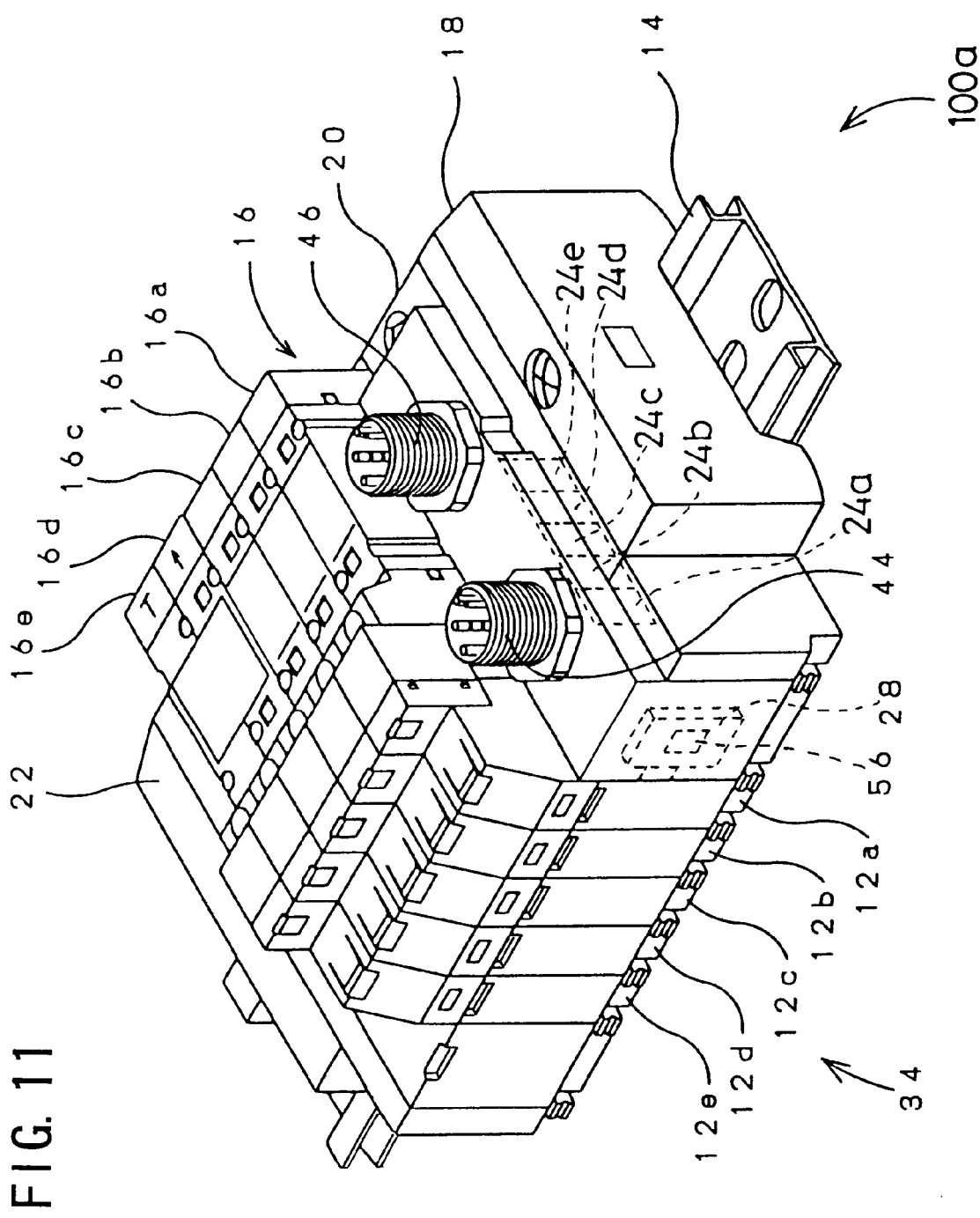
FIG. 11 shows a perspective view illustrating a modified embodiment of the solenoid-operated valve manifold shown in FIG. 10, depicting a state in which substrates are mounted at the inside of a mediating unit.

In this arrangement, as shown in a wiring diagram in FIG. 6, the respective substrates 24a to 24e are electrically connected to one another by the aid of connectors 60a to 60e (in FIG. 6, connectors 60c, 60d are omitted from the illustration). A substrate 28 carries a DC/DC converter 56 as described later on, and it is attached to the side surface of the mediating unit 20. As shown in FIG. 6, the substrate 28 is connected to connectors 44, 46, 60a. As shown in FIG. 11, the substrate 28 may be provided at the inside of the mediating unit 20.

Figure 3:
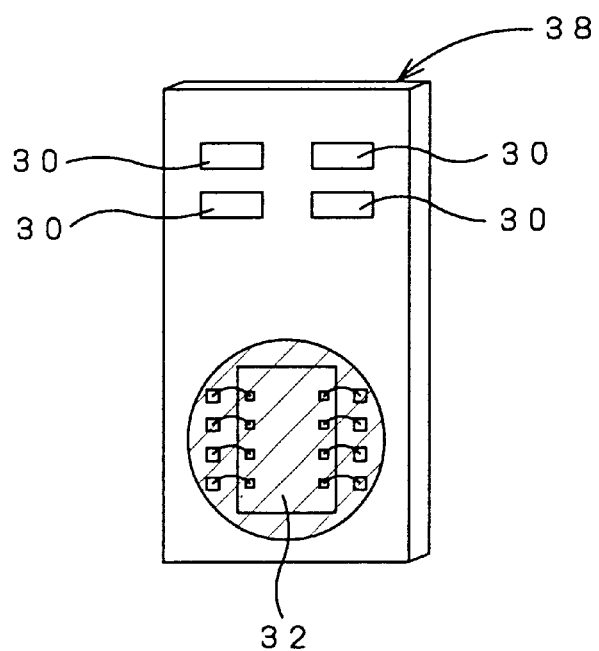
FIG. 3 shows a magnified perspective view illustrating another substrate.
Figure 4:
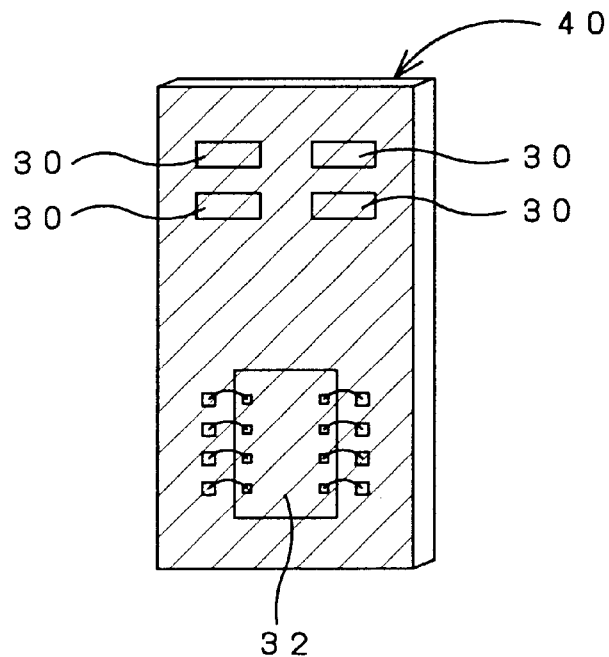
FIG. 4 shows a magnified perspective view illustrating still another substrate.
Figure 5:
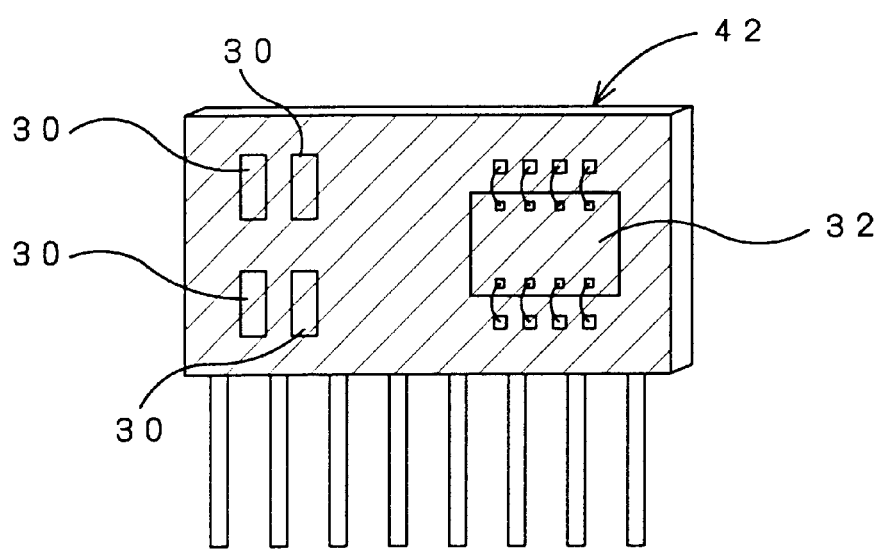
FIG. 5 shows a magnified perspective view illustrating still another substrate.

FIG. 3 shows a substrate 38 which carries a plurality of electronic parts 30 and an IC for communication 32 subjected to mold formation in a state of bare chip in order to avoid breakage and make protection from dust or the like. FIG. 4 shows a substrate 40 in which the entire substrate is subjected to mold formation to carry an IC for communication 32 and electronic parts 30 all of which or parts of which are in a state of bare chip. FIG. 5 shows an element 42 in which the entire substrate is formed into an integrated circuit to carry an IC for communication 32 and a plurality of electronic parts 30 all of which or parts of which are in a state of bare chip.

FIG. 6 shows the wiring diagram of the solenoid-operated valve manifold 10 shown in FIG. 1. With reference to FIG. 6, the mediating unit 20 is provided with the connectors 44, 46. The connector 44 includes a power source line 48 which is provided with power sources of DC 24 V and 0 V; a first signal line 50 which feeds a transmission signal S1 transmitted from a control equipment (not shown), for example, a sequence controller to the respective IC's for communication 32a to 32e of the solenoid-operated valves 16a to 16e and which transmits the signal to the next equipment, for example, an unillustrated solenoid-operated valve; and a second signal line 52 which transmits a transmission signal S2 sent from another control equipment, for example, a solenoid-operated valve to the next equipment, for example, a solenoid-operated valve via the IC's for communication 32a to 32e.

The connector 46 includes a power source line 54 which is branched from the power source line 48 and which feeds power sources of DC 24 V and 0 V to the next equipment, for example, a solenoid-operated valve; a first signal line 50; and a second signal line 52. The connectors 44, 46 are connected to the substrate 28. The DC/DC converter 56 is carried on the substrate 28 which is attached to the mediating unit 20. The DC/DC converter 56 converts the power sources of DC 24 V and 0 V flowing through the power source line 48 into the power sources of DC 5 V and 0 V, and it feeds the power sources of DC 5 V and 0 V to the IC's for communication 32a to 32e via a power source line 58.

The connectors 60a to 60e (in FIG. 6, the connectors 60c, 60d are omitted from the illustration) provided for the manifold 34 constructed by the manifold blocks 12a to 12e (in FIG. 6, the manifold blocks 12b, 12c, 12d are omitted from the illustration), and a connector 62 provided for the end plate 22 are provided with the power source line 48, the first signal line 50, the second signal line 52, and the power source line 58.

The connector 62, which is provided for the end plate 22, includes circuits 64, 66 with their first end sides being connected to the substrate 24e and with their second end sides allowing the first signal line 50 and the second signal line 52 inputted/outputted to the IC's for communication 32a to 32e respectively to be connected to the connectors 44, 46 of the mediating unit 20.

The respective solenoid-operated valves 16a to 16e are provided with first solenoids 68a to 68e and second solenoids 70a to 70e. Respective power source lines 72a to 72e, which are branched from the power source line 48 of DC 24 V, are connected to the first solenoids 68a to 68e and the second solenoids 70a to 70e respectively. Collectors of transistors 74a to 74e, 76a to 76e are connected thereto respectively. Respective bases of the transistors 74a to 74e, 76a to 76e are connected to signal lines 78a to 78e, 80a to 80e respectively conducted to the IC's for communication 32a to 32e. Respective emitters of the transistors 74a to 74e, 76a to 76e are connected to power source lines 82a to 82e respectively branched from the power source line 48 of 0 V. Reference numerals 84a to 84e indicate each of changeover switches for simultaneously operating the first solenoid 68a to 68e and the second solenoid 70a to 70e, or making changeover so that any one of the solenoids is in an operation state. When the changeover switch 84a to 84e is turned OFF, the first solenoid 68a to 68e and the second solenoid 70a to 70e are simultaneously operated. When the changeover switch 84a to 84e is turned ON, any one of the first solenoid 68a to 68e and the second solenoid 70a to 70e is operated.

The solenoid-operated valve manifold 10 according to the embodiment of the present invention is basically constructed as described above. Next, its operation, function, and effect will be explained with reference to the wiring diagram shown in FIG. 6.

The digital signal of a command to operate any one of the solenoid-operated valves 16a to 16e is sent to any one of the IC's for communication 32a to 32e via the connector 44 and the first signal line 50 from the outside. As for the IC's for communication 32a to 32e, for example, when the digital signal is inputted into the IC for communication 32a, the ON signal flows through the respective bases of the transistors 74a, 76a via the signal lines 78a, 80a from the IC for communication 32a. The respective collectors and the emitters of the transistors 74a, 76a are conducted to one another. The current flows through each of the first solenoid 68a and the second solenoid 70a of the solenoid-operated valve 16a. Accordingly, the solenoid-operated valve 16a is operated. In this embodiment, when any one of the first solenoid 68a and the second solenoid 70a of the solenoid-operated valve 16a is operated, the changeover switch 84a may be turned ON beforehand.

The other solenoid-operated valves 16b to 16e are operated in the same manner as the solenoid-operated valve 16a, detailed explanation of which will be omitted.

On the other hand, the digital signal of the second signal line 52, which is sent from the another solenoid-operated valve via the connector 46, is sent to the IC's for communication 32e to 32a. The digital signal is sent via the IC's for communication 32e to 32a to the next unillustrated solenoid-operated valve by the aid of the connector 44.

Figure 8:
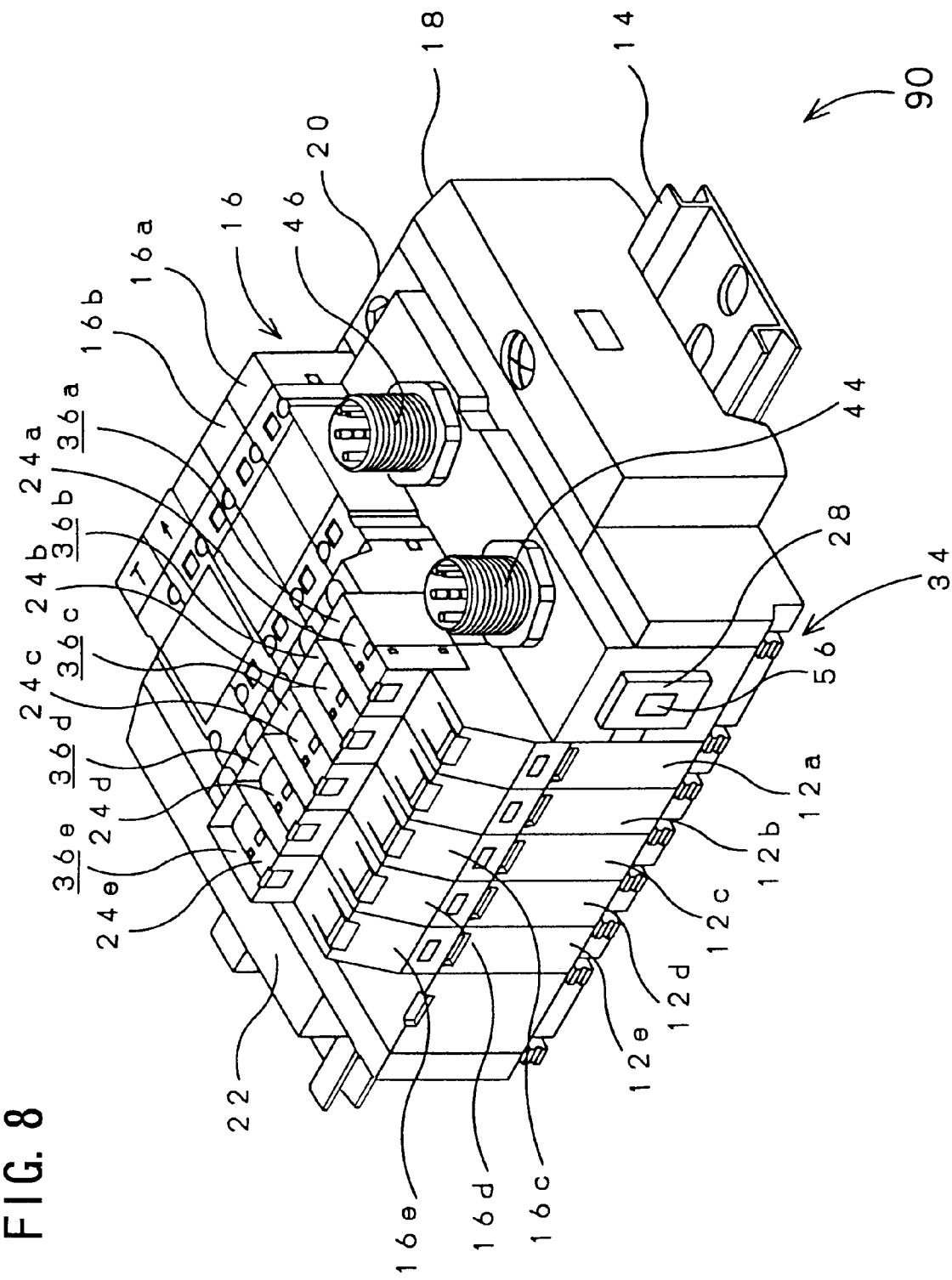
FIG. 8 shows a perspective view illustrating a solenoid-operated valve manifold according to a second embodiment of the present invention.
Figure 9:
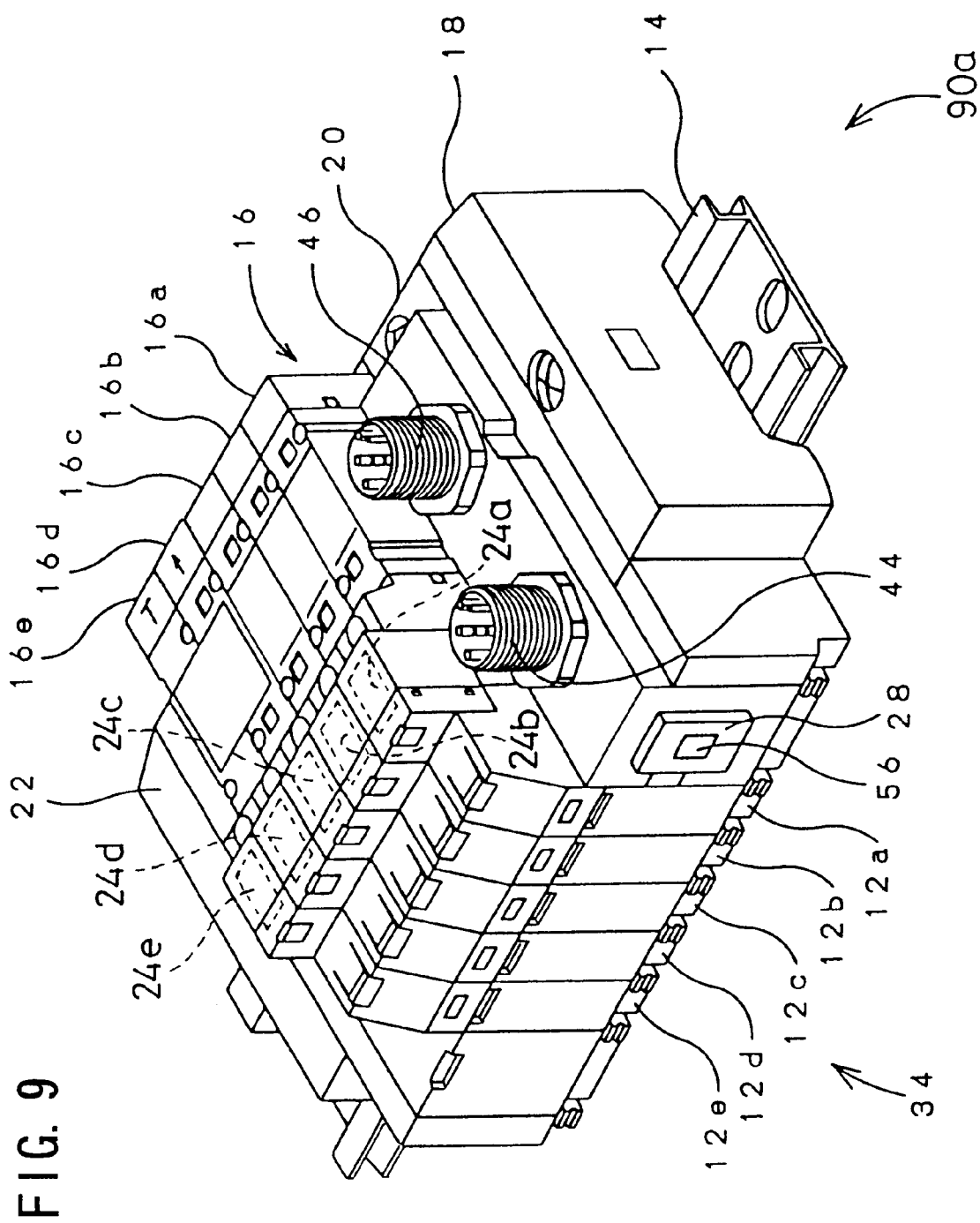
FIG. 9 shows a perspective view illustrating a modified embodiment of the solenoid-operated valve manifold shown in FIG. 8, depicting a state in which a substrate is mounted at the inside of each of solenoid-operated valves.

FIG. 8 shows a solenoid-operated valve manifold 90 depicting a second embodiment of the present invention. Respective substrates 24a to 24e are attached to recesses 36a to 36e which are defined at respective upper portions of the solenoid-operated valves 16a to 16e, and they are electrically wired with each other. As shown in FIG. 9, the substrate 24a to 24e may be mounted at the inside of the solenoid-operated valves 16a to 16e.

Figure 10:
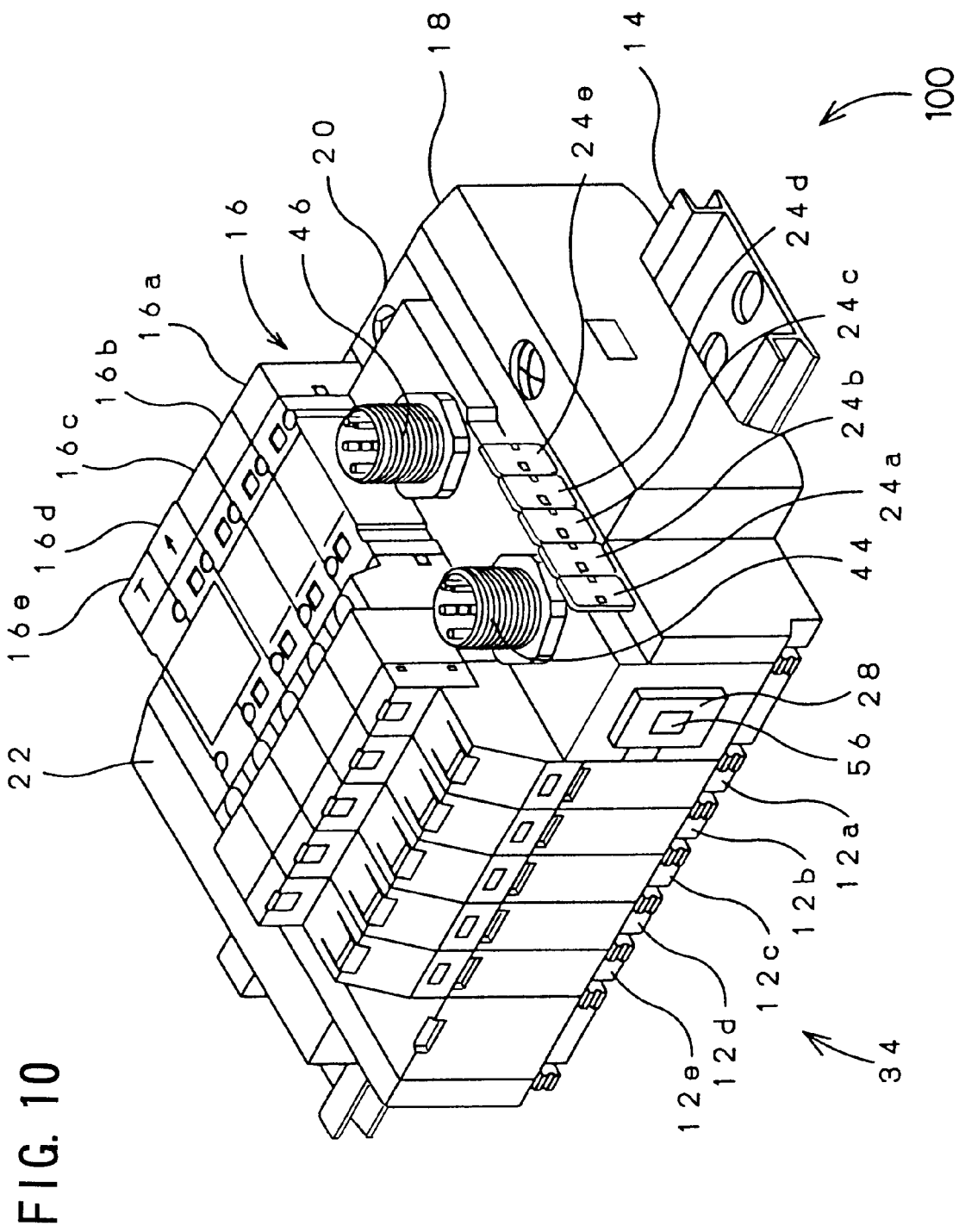
FIG. 10 shows a perspective view illustrating a solenoid-operated valve manifold according to a third embodiment of the present invention.

FIG. 10 shows a schematic arrangement of a solenoid-operated valve manifold 100 depicting a third embodiment of the present invention. Respective substrates 24a to 24e are attached substantially in sequence along a side surface of a mediating unit 20, and they are electrically wired with each other. As shown in FIG. 11, the substrates 24a to 24e may be mounted at the inside of the mediating unit 20.

In the present invention, it is a matter of course that the attachment places for the substrates 24a to 24e are not limited to the portions described above concerning the solenoid-operated valve manifolds 10, 10a, 90, 90a, 100, 100a shown in FIG. 1 and FIGS. 7 to 11, which may be any portion to which the substrate is successfully attached, including, for example, the interiors and the outer side surfaces of the manifold blocks 12a to 12e, the solenoid-operated valves 16a to 16e, and other components.

According to the first to third embodiments, the substrates 24, 24a to 24e, 38, 40 or the elements 42 are carried, for example, on the manifold 34 (manifold blocks 12a to 12e) or the solenoid-operated valves 16a to 16e. Furthermore, all or parts of the electronic parts 30 including the IC's for communication 32, 32a to 32e are miniaturized in the substrates 24, 24a to 24e, 38, 40. Accordingly, it is possible to decrease the volume of the solenoid-operated valve manifold 10, 10a, 90, 90a, 100, 100a. It is possible to realize a small size of the solenoid-operated valve manifold 10, 10a, 90, 90a, 100, 100a.

What is claimed is:

1. A solenoid-operated valve manifold comprising:
   a plurality of manifold blocks for constructing a manifold;

a plurality of solenoid-operated valves attached to said manifold;

a mediating unit arranged adjacently on a side of said manifold;

a plurality of recesses formed respectively on outer exposed surfaces of each of said manifold blocks; and a plurality of substrates, each of which carries electric parts including an integrated circuit for communication, said substrates being mounted respectively in each of said recesses formed on said outer exposed surfaces of the manifold blocks.

2. The solenoid-operated valve manifold according to claim 1, wherein said substrate includes an integrated circuit for communication subjected to mold formation.

3. The solenoid-operated valve manifold according to claim 1, wherein said substrate includes an integrated circuit for communication subjected to mold formation together with said electronic parts.

4. The solenoid-operated valve manifold according to claim 1, wherein said substrate is composed of an element in which said entire substrate is formed into an integrated circuit on which said electronic parts and said integrated circuit for communication are carried.

5. The solenoid-operated valve manifold according to claim 1, wherein said IC for communication is provided in a state of bare chip.

6. The solenoid-operated valve manifold according to claim 1, further comprising connectors for electrically connecting said adjoining manifold blocks to one another.

7. A solenoid-operated valve manifold comprising a plurality of solenoid-operated valves attached to a manifold, and a mediating unit arranged adjacently side by side with said manifold, wherein:

a substrate, which carries electric parts including an integrated circuit for communication, is mounted in each of recesses formed on outer surfaces of manifold blocks for constructing said manifold, and said substrates are mounted substantially in sequence along an outer side surface of said mediating unit.

8. The solenoid-operated valve manifold according to claim 7, wherein said substrate includes an integrated circuit for communication subjected to mold formation.

9. The solenoid-operated valve manifold according to claim 7, wherein said substrate includes an integrated circuit for communication subjected to mold formation together with said electronic parts.

10. The solenoid-operated valve manifold according to claim 7, wherein said substrate is composed of an element in which said entire substrate is formed into an integrated circuit on which said electronic parts and said integrated circuit for communication are carried.

11. The solenoid-operated valve manifold according to claim 7, wherein said IC for communication is provided in a state of bare chip.

12. The solenoid-operated valve manifold according to claim 7, further comprising connectors for electrically connecting said adjoining manifold blocks to one another.

13. A solenoid-operated valve manifold comprising a plurality of solenoid-operated valves attached to a manifold, and a mediating unit arranged adjacently side by side with said manifold, wherein:

a substrate, which carries electric parts including an integrated circuit for communication, is mounted at the inside of each of manifold blocks for constructing said manifold, and said substrates are mounted at the inside of said mediating unit.

14. The solenoid-operated valve manifold according to claim 13, wherein said substrate includes an integrated circuit for communication subjected to mold formation.

15. The solenoid-operated valve manifold according to claim 13, wherein said substrate includes an integrated circuit for communication subjected to mold formation together with said electronic parts.

16. The solenoid-operated valve manifold according to claim 13, wherein said substrate is composed of an element in which said entire substrate is formed into an integrated circuit on which said electronic parts and said integrated circuit for communication are carried.

17. The solenoid-operated valve manifold according to claim 13, wherein said IC for communication is provided in a state of bare chip.

18. The solenoid-operated valve manifold according to claim 13, further comprising connectors for electrically connecting said adjoining manifold blocks to one another.

* * * * *